US012765100B2

(12) United States Patent
Chang et al.

(10) Patent No.: US 12,765,100 B2
(45) Date of Patent: Oct. 13, 2026

(54) IMAGE SENSOR HAVING DEEP ISOLATION REGIONS

(71) Applicant: Taiwan Semiconductor Manufacturing Company, Ltd., Hsin-Chu (TW)

(72) Inventors: Po Chun Chang, New Taipei City (TW); Ping-Hao Lin, Tainan City (TW); Kun-Hui Lin, Tainan City (TW); Kuo-Cheng Lee, Tainan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 698 days.

(21) Appl. No.: 18/183,574

(22) Filed: Mar. 14, 2023

(65) Prior Publication Data

US 2024/0030262 A1 Jan. 25, 2024

Related U.S. Application Data

(60) Provisional application No. 63/386,779, filed on Dec. 9, 2022, provisional application No. 63/391,129, filed on Jul. 21, 2022.

(51) Int. Cl.
*H10F 39/00* (2025.01)
*H10F 39/18* (2025.01)

(52) U.S. Cl.
CPC ......... *H10F 39/807* (2025.01); *H10F 39/014* (2025.01); *H10F 39/18* (2025.01)

(58) Field of Classification Search
CPC ......... H10F 39/014; H10F 39/18–1898; H10F 39/807
See application file for complete search history.

(56) References Cited

U.S. PATENT DOCUMENTS

| | | | | |
|---|---|---|---|---|
| 8,937,272 | B2 * | 1/2015 | Hynecek | H10F 39/199 250/214 R |
| 9,281,331 | B2 | 3/2016 | Chen et al. | |
| 11,075,242 | B2 | 7/2021 | Kuo et al. | |

(Continued)

FOREIGN PATENT DOCUMENTS

| | | | |
|---|---|---|---|
| CN | 112103338 | A | 12/2020 |
| TW | 202201655 | A | 1/2022 |
| TW | 202213743 | A | 4/2022 |

*Primary Examiner* — Kevin Parendo
(74) *Attorney, Agent, or Firm* — HAYNES AND BOONE, LLP

(57) ABSTRACT

A semiconductor structure is disclosed. The semiconductor structure includes a number of pixels and neighboring pixels are isolated by deep trench isolation structures. In an embodiment, a method of forming the semiconductor structure includes epitaxially growing a p-type semiconductor layer on a substrate, epitaxially growing an n-type semiconductor layer over the p-type semiconductor layer, after the epitaxially growing of the n-type semiconductor layer, forming a p-type well in the n-type semiconductor layer, forming an n-type doped region in the n-type semiconductor layer and surrounded by the p-type well, forming a first trench extending through the n-type semiconductor layer and the p-type semiconductor layer and surrounding the p-type well, and forming a first isolation structure in the first trench.

20 Claims, 18 Drawing Sheets

(56) References Cited

U.S. PATENT DOCUMENTS

| | | | | |
|---|---|---|---|---|
| 2011/0241079 | A1* | 10/2011 | Oike | H10F 39/80377<br>257/E27.15 |
| 2012/0199882 | A1* | 8/2012 | Shin | H10F 39/18<br>257/E31.073 |
| 2016/0126271 | A1* | 5/2016 | Sakurano | H10F 39/8033<br>257/292 |
| 2017/0373108 | A1* | 12/2017 | Hwangbo | H10F 39/199 |
| 2018/0294304 | A1* | 10/2018 | Janssens | H10F 39/18 |
| 2019/0287804 | A1 | 9/2019 | Weis | |

* cited by examiner

IMAGE SENSOR HAVING DEEP ISOLATION REGIONS

PRIORITY DATA

This application claims priority to U.S. Provisional Patent Application No. 63/391,129, filed on Jul. 21, 2022, and U.S. Provisional Patent Application No. 63/386,779 filed on Dec. 9, 2022, the entire disclosures of which are hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

The technologies used to manufacture image sensors, such as complementary metal oxide semiconductor (CMOS) image sensor technology, have continued to advance as well. The demands for higher resolution and lower power consumption have driven the trend of further miniaturization and integration of image sensors. The corresponding pixels in image sensors are therefore scaled down. This scaling down process generally provides benefits by increasing production efficiency and lowering associated costs. Such scaling down has also increased the complexity of processing and manufacturing. For example, as the sizes of pixels continue to decrease, optical cross talk and interference among pixels may occur more often. In addition, as the sizes of pixels continue to decrease, controlling the accuracy of implantation processes for forming various doped regions in the pixels became challenging. Although existing CMOS image sensors have been generally adequate for their intended purposes, they are not satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
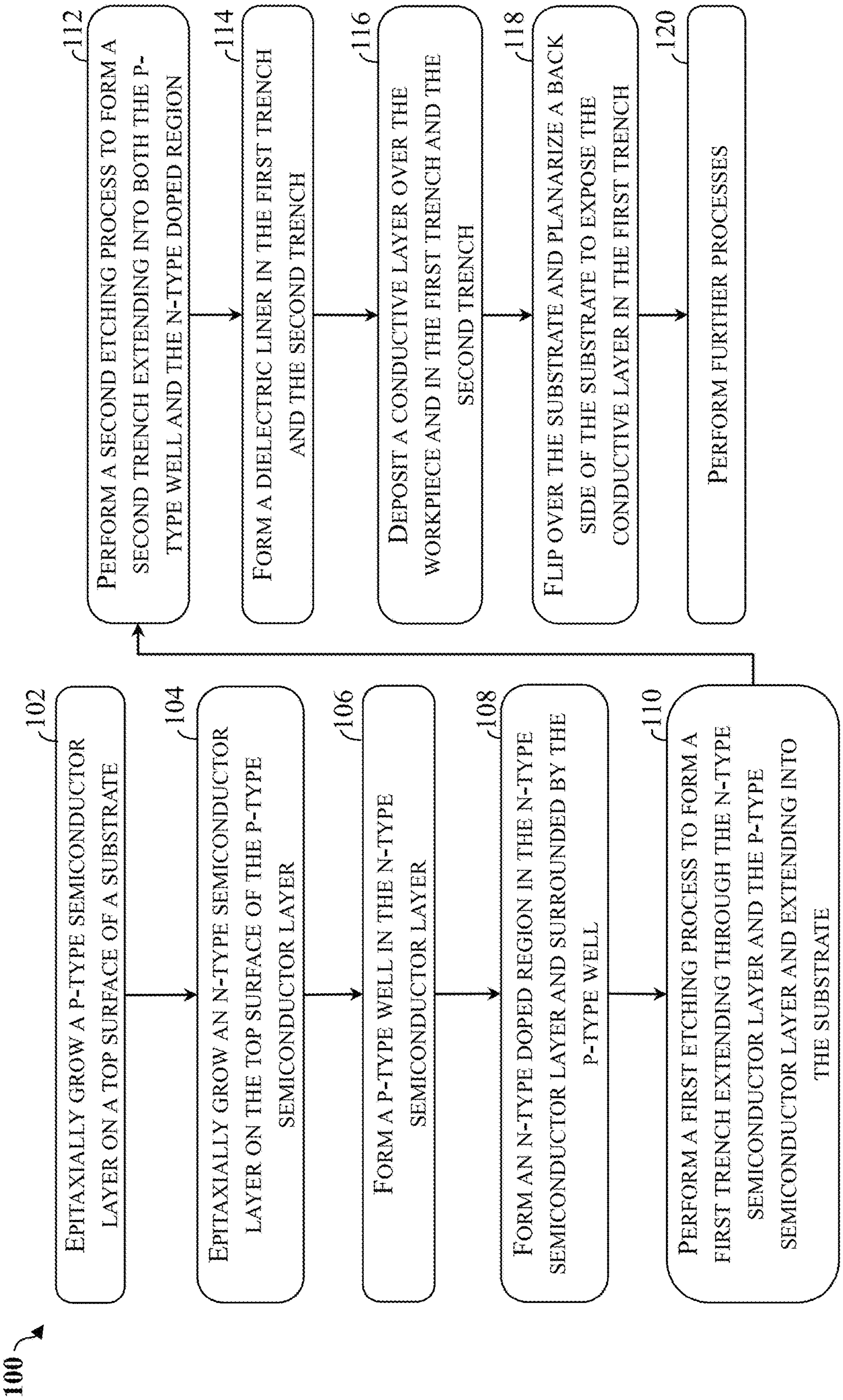
FIG. 1 illustrates a flowchart of an exemplary method for fabricating a semiconductor structure, according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

An image sensor may include an array of pixels arranged in two dimensions. Each of the pixels includes a photodiode and a number of transistors (e.g., transfer gate transistor) formed in a pixel region. Generally, the photodiode includes an n-type region having a gradient doping profile to increase charge transfer from the photodiode to a floating diffusion region of the pixel. According to the gradient doping profile, a dopant concentration of an upper portion of the n-type region that is closer to a gate structure of the transfer gate transistor is higher than a dopant concentration of a lower portion of the n-type region of the photodiode that is further away from that gate structure. In some existing technologies, form the n-type region of the photodiode in a small pixel includes forming a thick photoresist layer over a p-type substrate, patterning the thick photoresist layer to form a patterned thick photoresist layer, and performing ion implantation processes while using the patterned thick photoresist layer as an implantation mask. However, for devices having small pixel pitches, the patterned thick photoresist layer may collapse due to its high aspect ratio (i.e., a ratio of its thickness to its width), leading to unsatisfactory implantation results and degraded pixel's performance. In addition, deep trench isolation (DTI) structures have been picked as a promising approach for isolating neighboring pixels of CMOS image sensors. During the manufacturing of the image sensors, surface defects (e.g., dangling bonds) may be formed in a region of a semiconductor substrate adjacent to the sidewall of the DTI structure. Such surface defects may thermally generate electric charges even without any incident light. If left untreated, the surface defects may produce dark currents, leading to white pixels. It is desirable to increase passivation along the entire sidewall of the DTI structure to reduce the surface defects.

The present disclosure is generally related to image sensors. More particularly, some embodiments are related to CMOS image sensors with a DTI structure defining an array of pixel regions for components of pixels to reside therein. In an embodiment, the n-type region of the photodiode are formed by mask-less epitaxial growth processes and in-situ doped, rather than using photolithography processes that require high resolution. Thus, fabrication costs may be advantageously reduced. In some embodiments, the DTI structure is a hybrid structure that includes a dielectric liner extending along sidewall surfaces of a conductive material layer. By applying an appropriate bias voltage to the conductive material layer, carrier accumulation may be formed near the sidewall of the DTI structure to reduce the surface defects. In some embodiments, a gate structure of the transfer gate transistor may be a vertical gate structure surrounding the floating diffusion region of the pixel, thereby providing better control for the charge transfer.

Figure 17:
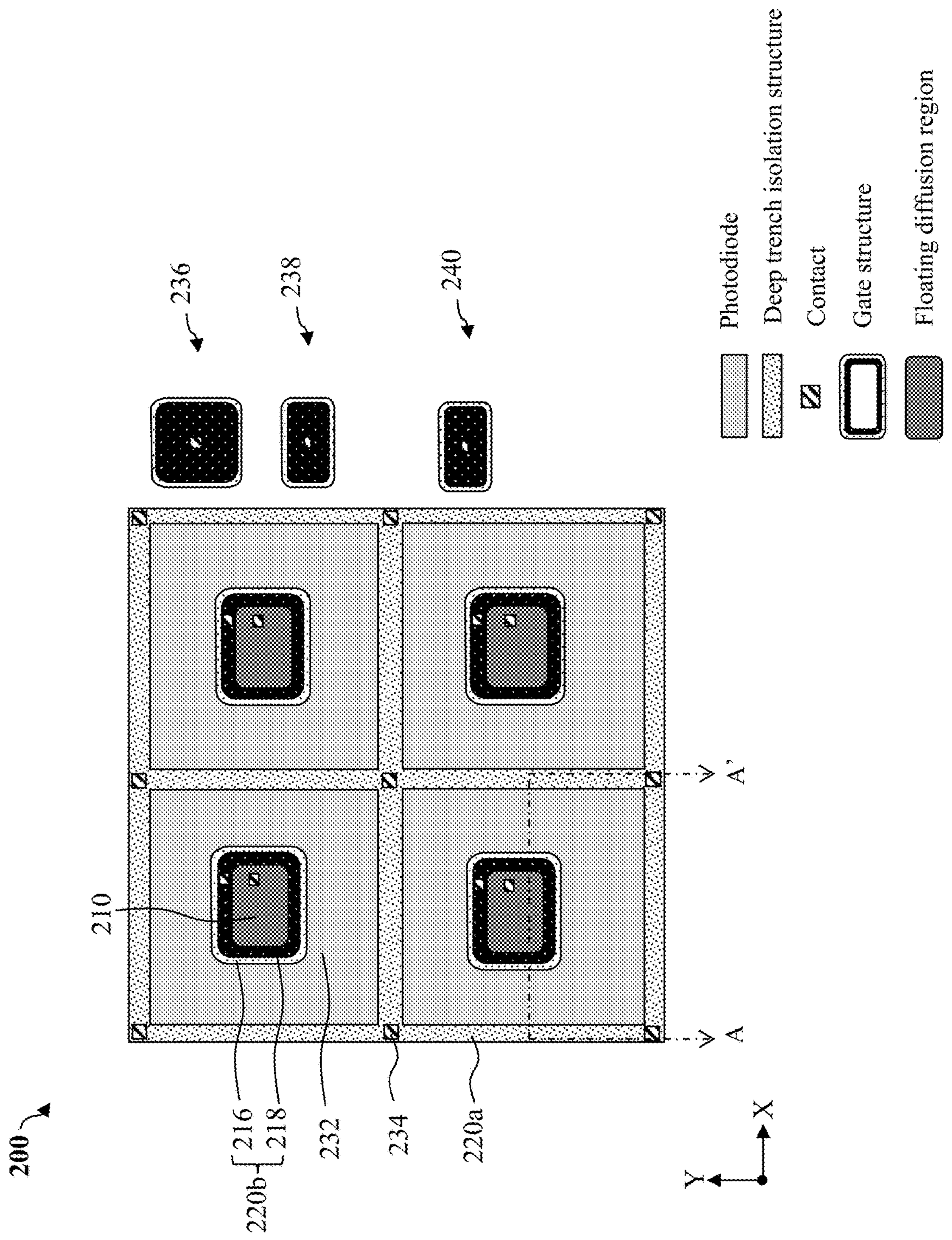
FIG. 17 illustrates a fragmentary top view of the semiconductor structure, according to various aspects of the disclosure.
Figure 18:
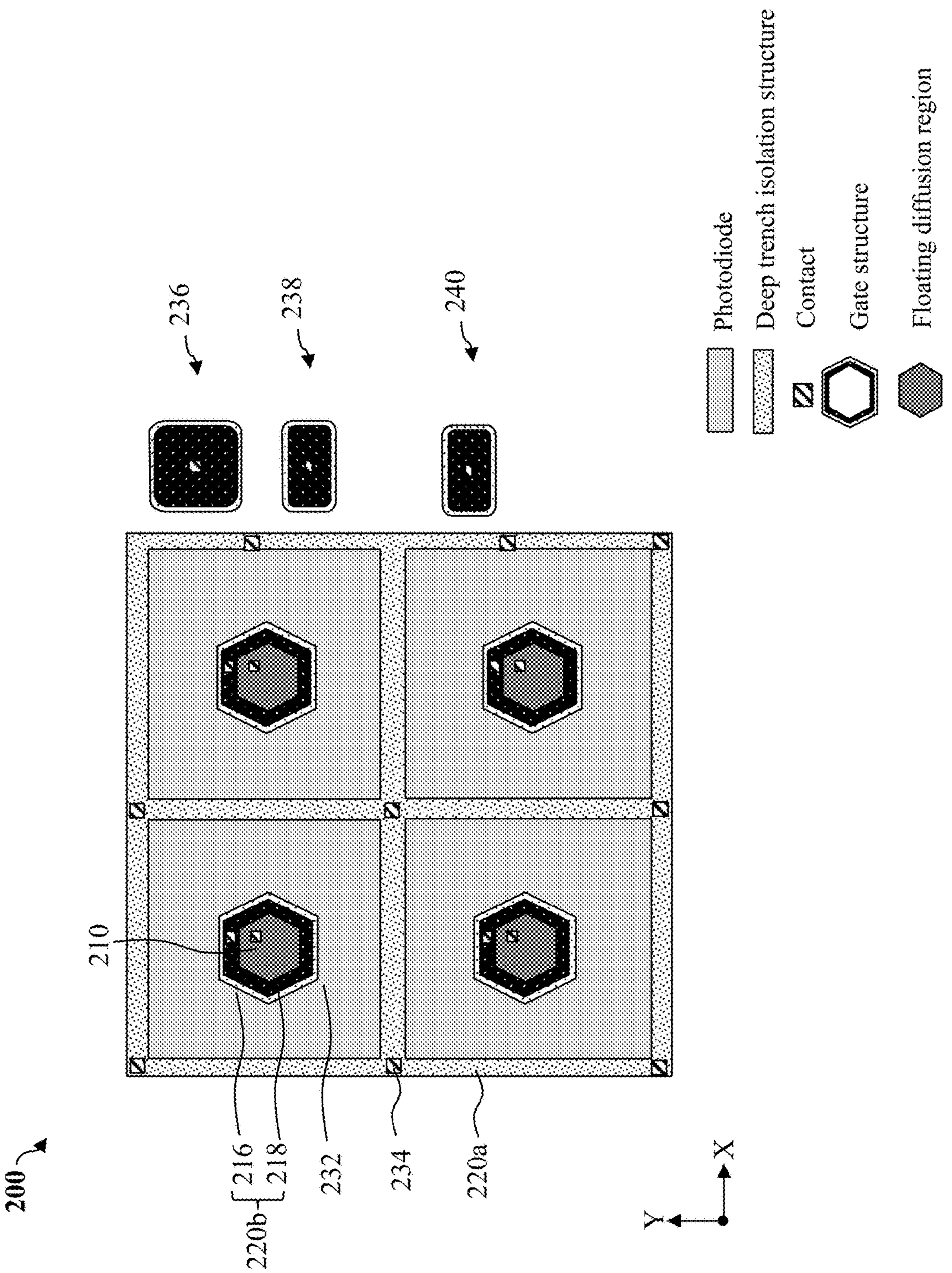
FIG. 18 illustrates a fragmentary top view of an alternative semiconductor structure, according to various aspects of the disclosure.

The various aspects of the present disclosure will now be described in more detail with reference to the figures. In that regard, FIG. 1 is a flowchart illustrating method 100 of forming a semiconductor structure according to embodiments of the present disclosure. Method 100 is described below in conjunction with FIGS. 2-18, where FIGS. 2-16 are fragmentary cross-sectional views of a workpiece 200 at different fabrication stages in the method of FIG. 1 and FIGS. 17-18 show exemplary fragmentary top views of the semiconductor structure. Method 100 is merely an example and is not intended to limit the present disclosure to what is explicitly illustrated therein. Additional steps may be provided before, during and after the method 100, and some steps described can be replaced, eliminated, or moved around for additional embodiments of the method. Not all steps are described herein in detail for reasons of simplicity. Because the workpiece 200 will be fabricated into a semiconductor structure 200 or an image sensor 200 upon conclusion of the fabrication processes, the workpiece 200 may be referred to as a semiconductor structure 200 or an image sensor 200 depending on the context. The method 100 may be used to form stacked silicon CMOS image sensors, non-stack image sensors, and other suitable structures. For avoidance of doubts, the X, Y and Z directions in the figures are perpendicular to one another and are used consistently. Throughout the present disclosure, like reference numerals denote like features unless otherwise excepted.

Figure 2:
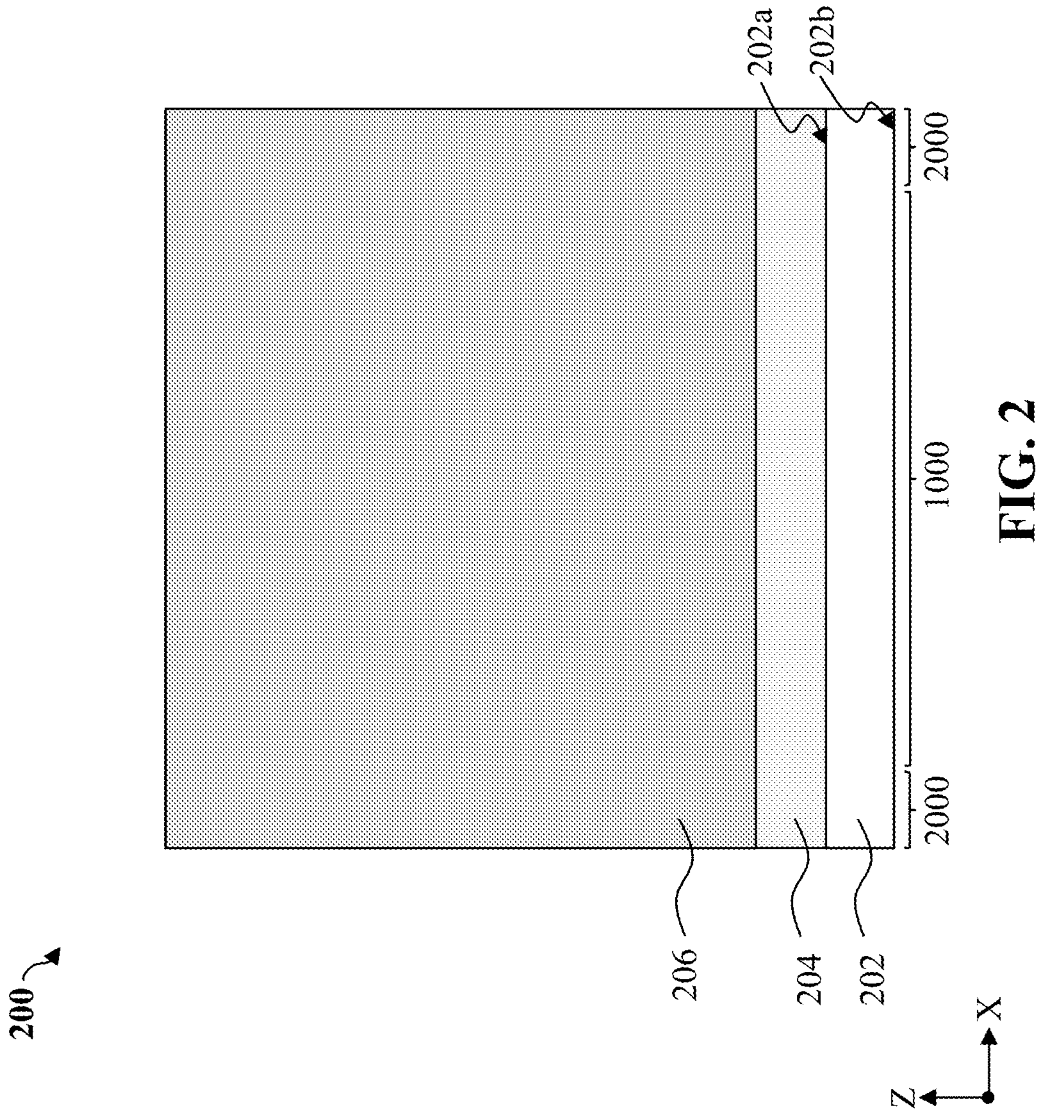
FIGS. 2, 3, 4, 5, 6, 7, 8, 9, 10, 11, 12, 13, 14 and 15 illustrate fragmentary cross-sectional views of a workpiece during various fabrication stages in the method of FIG. 1, according to various aspects of the disclosure.

Referring to FIGS. 1-2, method 100 includes a block 102 where a p-type semiconductor layer 204 is epitaxially formed over a front-side surface of a substrate 202. A workpiece 200 is provided. The workpiece 200 includes a number of pixel regions (e.g., a pixel region 1000 for forming a pixel) and a number of isolation regions (e.g., an isolation region 2000) for forming isolation structures (e.g., deep trench isolation structures). Upon conclusion of the fabrication process in method 100, an isolation structure (e.g., DTI structure 220*a* shown in FIG. 8) formed in the isolation regions 2000 isolates two adjacent pixel regions 1000. The isolation regions 2000 may be disposed at the edges of each of the pixel regions 1000, such that each of the pixel regions 1000 may be defined as a closed space surrounded by walls of the to-be-formed isolation structures (e.g., DTI structure 220*a* shown in FIG. 8) from a top view.

The workpiece 200 includes a substrate 202. In an embodiment, the substrate 202 is a bulk silicon substrate (i.e., including bulk single-crystalline silicon). The substrate 202 may include other semiconductor materials in various embodiments, such as germanium, silicon carbide, gallium arsenide, gallium phosphide, indium phosphide, indium arsenide, indium antimonide, SiGe, GaAsP, AlinAs, AlGaAs, GalnAs, GaInP, GaInAsP, or combinations thereof. In some alternative embodiments, the substrate 202 may include a semiconductor-on-insulator substrate, such as a silicon-on-insulator (SOI) substrate, a silicon germanium-on-insulator (SGOI) substrate, or a germanium-on-insulator (GOI) substrate, and includes a carrier, an insulator on the carrier, and a semiconductor layer on the insulator. In an embodiment, the substrate 202 includes un-doped silicon. The substrate 202 includes a first surface 202*a* and a second surface 202*b* facing each other. In embodiments represented in FIG. 2, the first surface 202*a* is the top surface or the front-side surface of the substrate 202, and the second surface 202*b* is the bottom surface or the back-side surface of the substrate 202.

Still referring to FIG. 2, a first semiconductor layer 204 is formed on the first surface 202*a* of the substrate 202. In the present embodiment, an epitaxial growth process is performed to epitaxially grow the first semiconductor layer 204. The first semiconductor layer 204 may be formed by using processes such as vapor-phase epitaxy (VPE), ultra-high vacuum chemical vapor deposition (UHV-CVD), low pressure vapor deposition (LPCVD), and/or plasma-enhanced chemical vapor deposition (PECVD), molecular beam epitaxy (MBE), or other suitable epitaxy processes, or combinations thereof. The epitaxial growth process allows the first semiconductor layer 204 to grow from the first surface 202*a* of the substrate. In the present embodiment, the first semiconductor layer 204 is a p-type semiconductor layer and may be referred to as a p-type epitaxial layer 204. The p-type epitaxial layer 204 is in-situ doped with dopant(s). For example, the p-type epitaxial layer 204 may include silicon doped with boron. Forming the p-type semiconductor layer 204 may advantageously block or reduce electrons in the n-type semiconductor layer 206 (shown in FIG. 2) from moving to the photodiode's bottom surface. In some embodiments, a thickness of the p-type semiconductor layer 204 may be between several nanometers and hundreds of nanometers.

Still referring to FIGS. 1-2, method 100 includes a block 104 where a second semiconductor layer 206 is epitaxially formed on the first semiconductor layer 204. A doping polarity of the second semiconductor layer 206 is opposite to the doping polarity of the first semiconductor layer 204. In embodiments where the first semiconductor layer 204 is a p-type semiconductor layer, the second semiconductor layer 206 is an n-type semiconductor layer. The second semiconductor layer 206 may be referred to as the n-type semiconductor layer in the present embodiment. An epitaxial growth process is performed to epitaxially grow the n-type semiconductor layer 206. The n-type semiconductor layer 206 may be formed by using processes such as vapor-phase epitaxy (VPE), ultra-high vacuum chemical vapor deposition (UHV-CVD), low pressure vapor deposition (LPCVD), and/or plasma-enhanced chemical vapor deposition (PECVD), molecular beam epitaxy (MBE), or other suitable epitaxy processes, or combinations thereof. The epitaxial growth process allows the n-type semiconductor layer 206 to grow from the top surface of the p-type semiconductor layer 204. The n-type semiconductor layer 206 may also be referred to as an n-type epitaxial layer 206. The n-type semiconductor layer 206 is in-situ doped with dopant(s). For example, the n-type semiconductor layer 206 may include silicon doped with phosphorous. In an embodiment, the n-type semiconductor layer 206 is a charge-collection portion of a photodiode. A PN junction may be formed near the top surface of the p-type semiconductor layer 204, thereby blocking or reducing electrons in the n-type semiconductor layer 206 from moving to the bottom surface of the n-type semiconductor layer 206. In various embodiments, a dopant concentration of the n-type semiconductor layer 206 is not uniform along the Z direction. In an embodiment, the dopant concentration of the n-type semiconductor layer 206 is increasingly grading from its bottom surface to its top surface to improve the efficiency of the photodiode. For example, a dopant concentration of an upper portion of the n-type semiconductor layer 206 is greater than a dopant concentration of a lower portion of the n-type semiconductor layer 206. Since the n-type semiconductor layer 206 is epitaxially formed and the dopant concentration may be adjusted along the epitaxial growth process, implantation process (e.g., ion implantation) that used to form n-type doped regions in a p-type substrate may be omitted. Therefore, fabrication cost associated with the formation of the n-type regions of the photodiode may be advantageously, and the fabrication processes for forming devices having small pixel pitches may be simplified.

Figure 3:
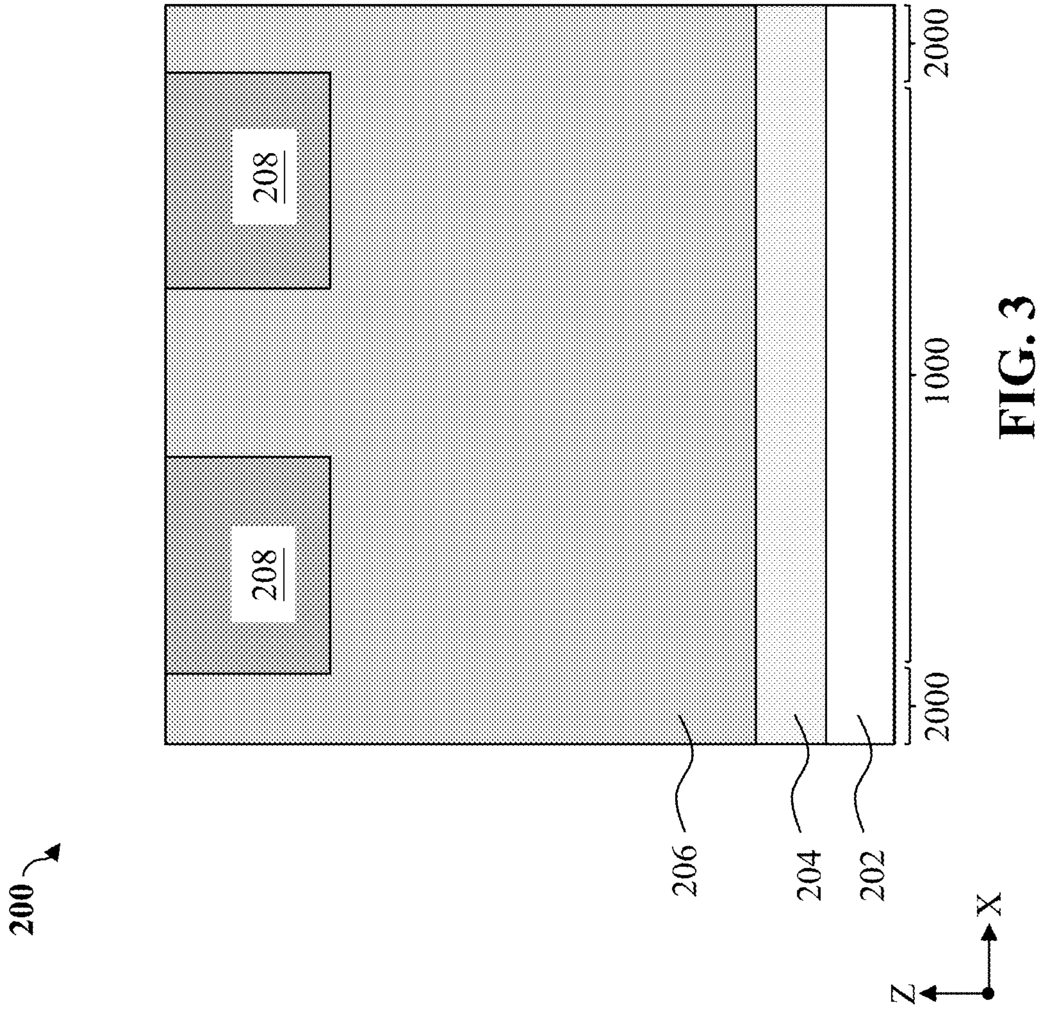

Referring to FIGS. 1 and 3, method 100 includes a block 106 where a doped well 208 is formed in the second semiconductor layer 206 and in the pixel region 1000. A doping polarity of the doped well 208 is opposite to the doping polarity of the second semiconductor layer 206. In embodiments where the second semiconductor layer 206 is an n-type semiconductor layer, the doped well 208 is a p-type well 208. The p-type well 208 may be referred to as a p well 208. After epitaxially forming the n-type semiconductor layer 206, a photoresist layer (not shown) may be formed over the n-type semiconductor layer 206, exposed to a radiation source using a photo mask, and subsequently developed to form a patterned photoresist layer. While using the patterned photoresist layer as an implantation mask, a doping process may be performed to form the p-type well 208 in the n-type semiconductor layer 206. Forming the p-type well 208 in the n-type semiconductor layer 206 may block or reduce electrons in the n-type semiconductor layer 206 from moving to the photodiode's top surface. In the present embodiment, the doping process may include an ion implantation process and may be performed by implanting appropriate p-type dopants (e.g., boron). A thickness of the p-type well 208 may be between several nanometers and hundreds of nanometers. In an embodiment, in a top view, the p-type well 208 may include a ring shape. In the cross-sectional view of the workpiece 200 depicted in FIG. 3, two portions of the p-type well 208 are shown. The patterned photoresist layer may be selectively removed after the formation of the p-type well 208.

Figure 4:
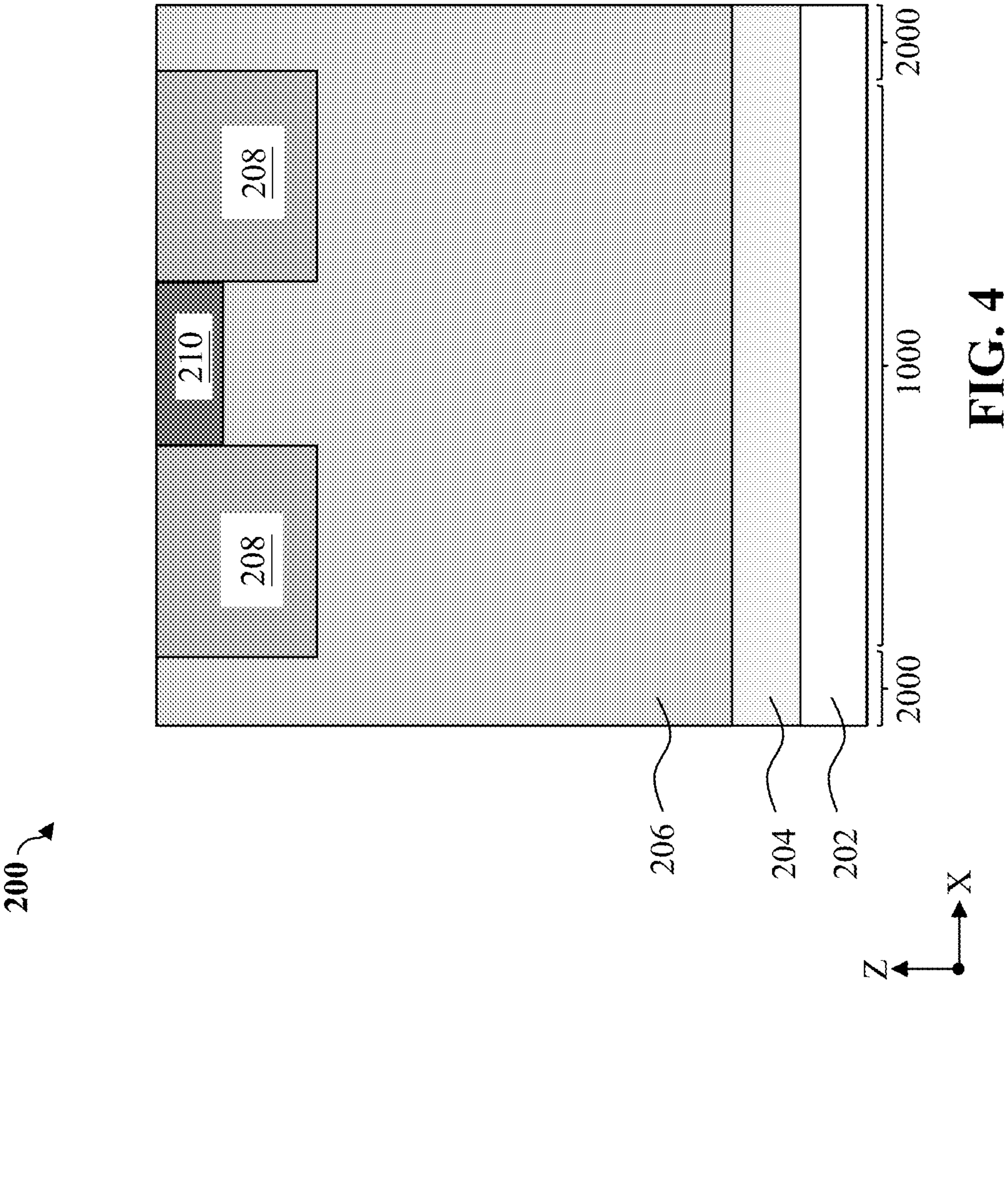

Referring to FIGS. 1 and 4, method 100 includes a block 108 where a doped region 210 is formed in the second semiconductor layer 206 and in the pixel region 1000. A doping polarity of the doped region 210 is the same as the doping polarity of the second semiconductor layer 206. In embodiments where the second semiconductor layer 206 is an n-type semiconductor layer, the doped region 210 is an n-type doped region 210. The n-type doped region 210 may be also referred to as a floating diffusion region 210. In the present embodiments, after forming the p-type well 208, another patterned photoresist layer (not shown) may be formed over the n-type semiconductor layer 206. While using the patterned photoresist layer as an implantation mask, a doping process (e.g., ion implantation process) may be performed to form the n-type doped region 210 in the n-type semiconductor layer 206. The doping process may include an ion implantation process and may be performed by implanting appropriate n-type dopants (e.g., phosphorus, arsenic). A dopant concentration of the n-type doped region 210 may be greater than a dopant concentration of the p-type well 208. In an embodiment, the n-type doped region 210 may be a heavily doped region and the p-type well 208 may be a lightly doped region. A depth of the n-type doped region 210 may be less than a depth of the p-type well 208. In an embodiment, in a top view, the p-type well 208 surrounds the n-type doped region 210.

Figure 5:
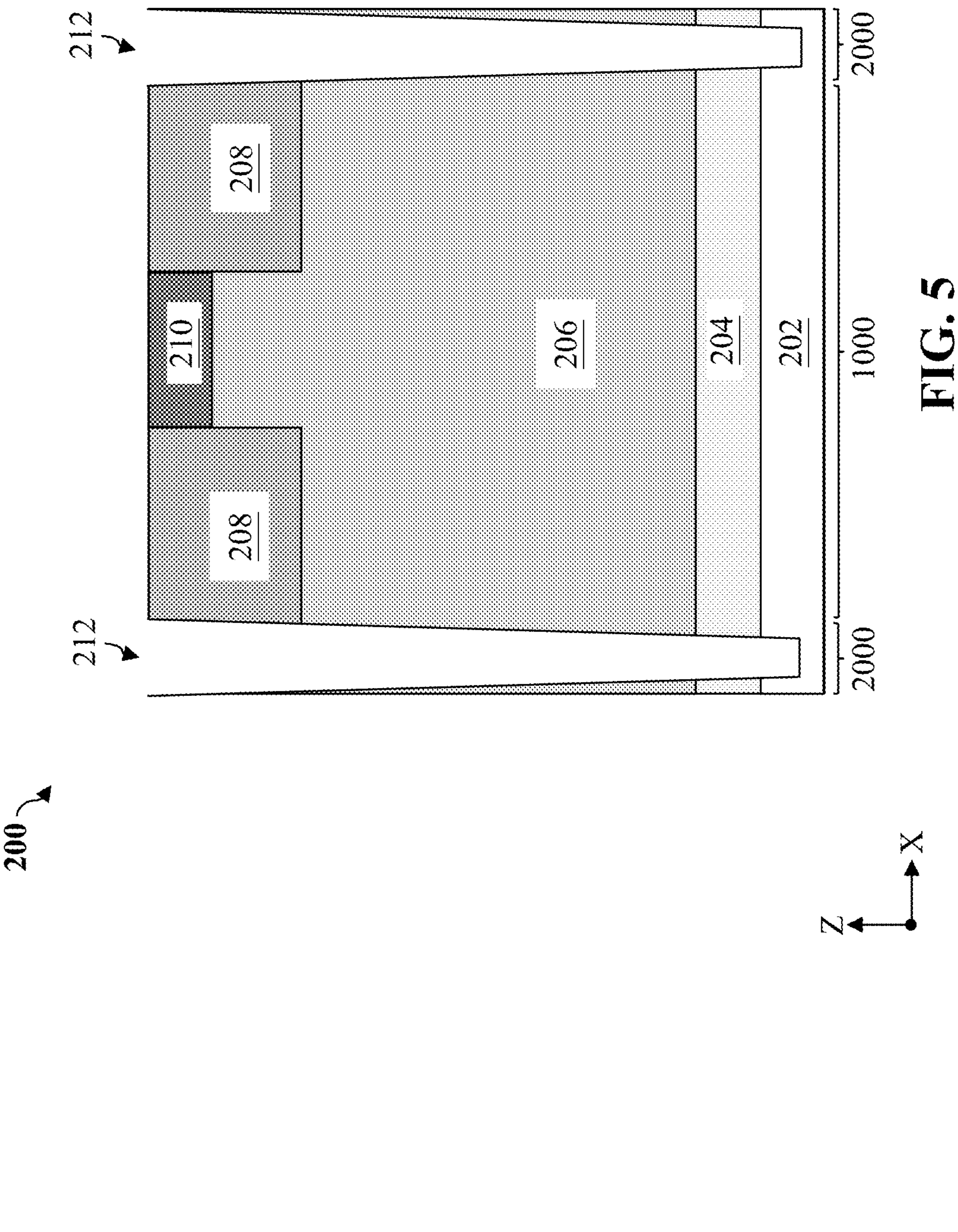
Figure 14:
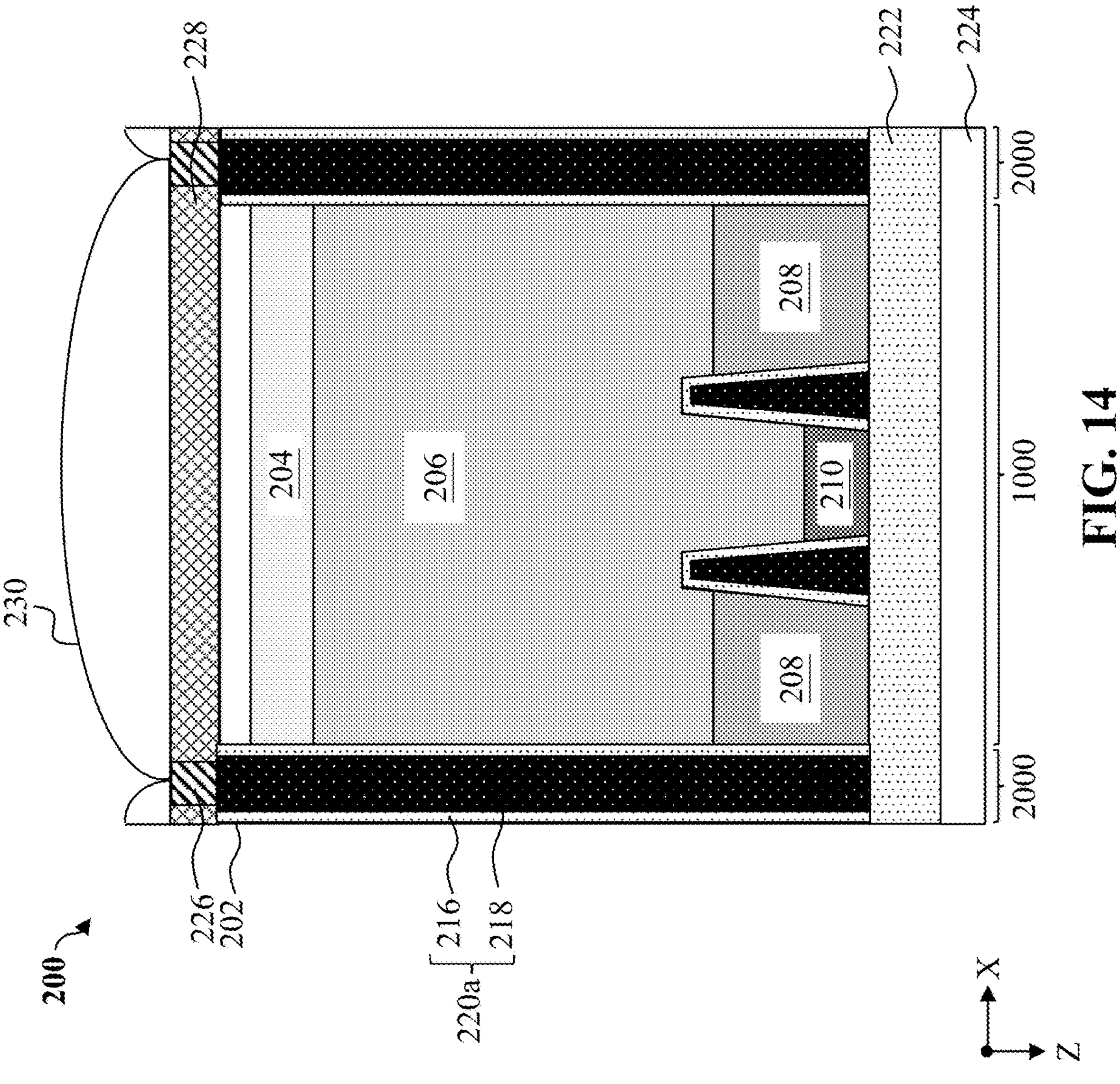
Figure 15:
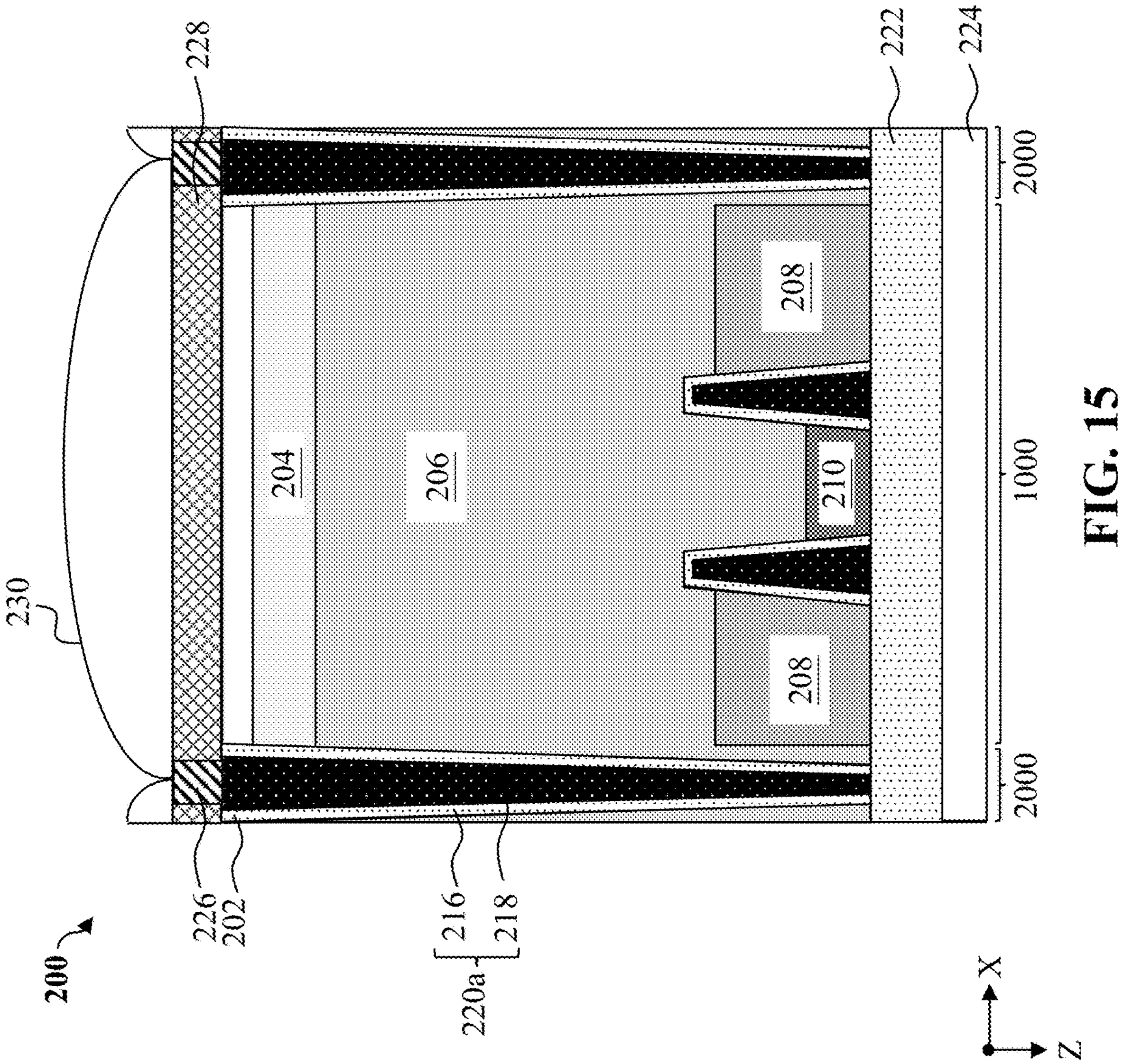
Figure 16:
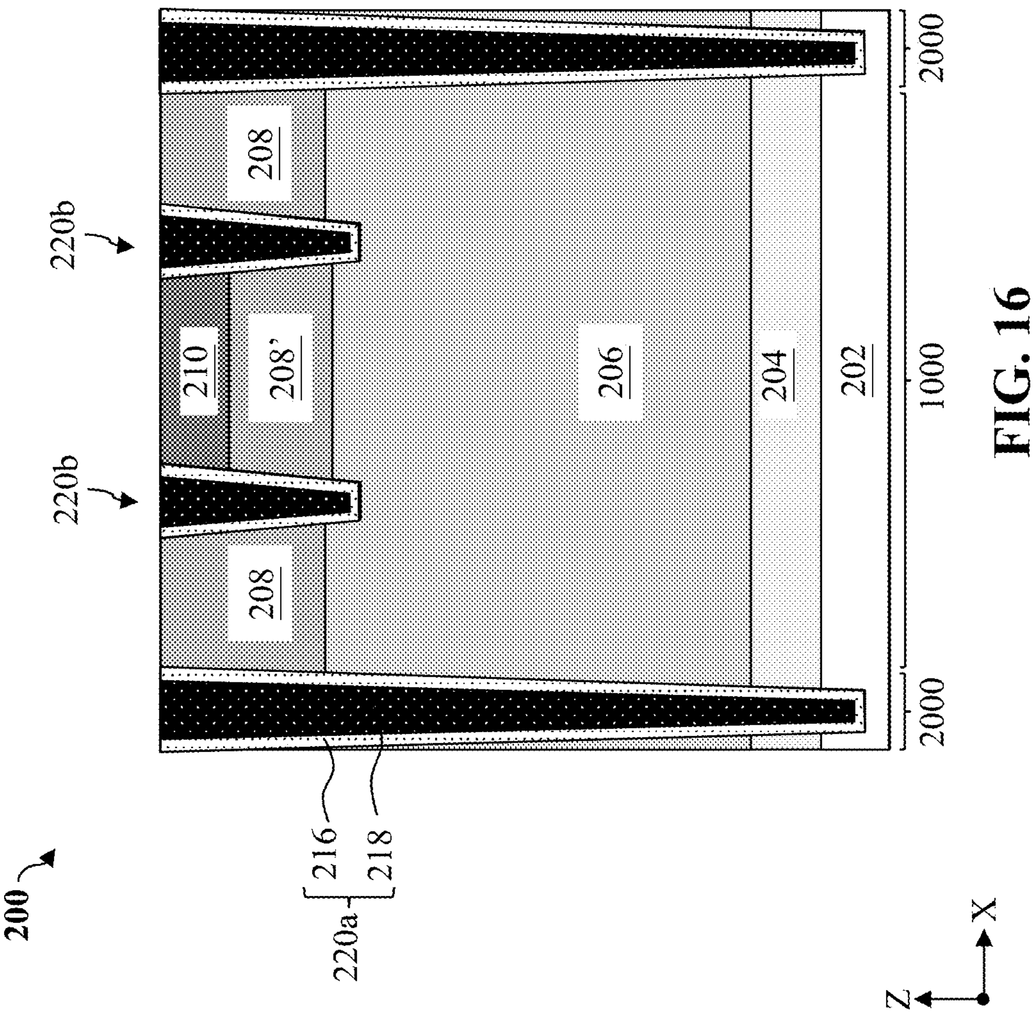
FIG. 16 illustrates a fragmentary cross-sectional view of an alternative embodiment of the workpiece shown in FIG. 8, according to various aspects of the disclosure.

Referring to FIGS. 1 and 5, method 100 includes a block 110 where a first etching process is performed to form a first trench 212 extending through the n-type semiconductor layer 206 and the p-type semiconductor layer 204 and extending into the substrate 202. The first trench 212 surrounds the p-type well 208. In an embodiment, in a top view, a shape of the first trench 212 includes a ring shape. In the cross-sectional view of the workpiece 200 depicted in FIG. 5, two portions of the first trench 212 are shown. In some embodiments, the formation of the first trench 212 includes forming a patterned mask film (e.g., photoresist layer or a hard mask layer) (not shown) over the workpiece 200. The patterned mask film may include an opening exposing portions of the p-type well 208 and the n-type semiconductor layer 206 in the isolation region 2000. In some embodiments, the patterned mask film may include silicon nitride, silicon carbonitride, silicon oxycarbide, silicon oxynitride, silicon oxycarbonitride, other suitable materials, or combinations thereof, and may be formed by chemical vapor deposition (CVD), physical vapor deposition (PVD), other suitable methods, or combinations thereof. While using the patterned mask film as an etch mask, a first etching process is performed to form the first trench 212 in the isolation region 2000. In the present embodiment, the first trench 212 extends through the p-type well 208, the n-type semiconductor layer 206, the p-type semiconductor layer 204 and extends into the substrate 202. That is, the first trench 212 exposes the substrate 202. The first etching process may be a dry etching process, a wet etching process, or a combination thereof that implements a suitable etchant. The first trench 212 may include tapered sidewalls as shown in FIG. 5 or FIG. 15 or having substantially vertical sidewalls as shown in FIG. 14. The patterned mask film may be selectively removed after the formation of the first trench 212.

Figure 6:
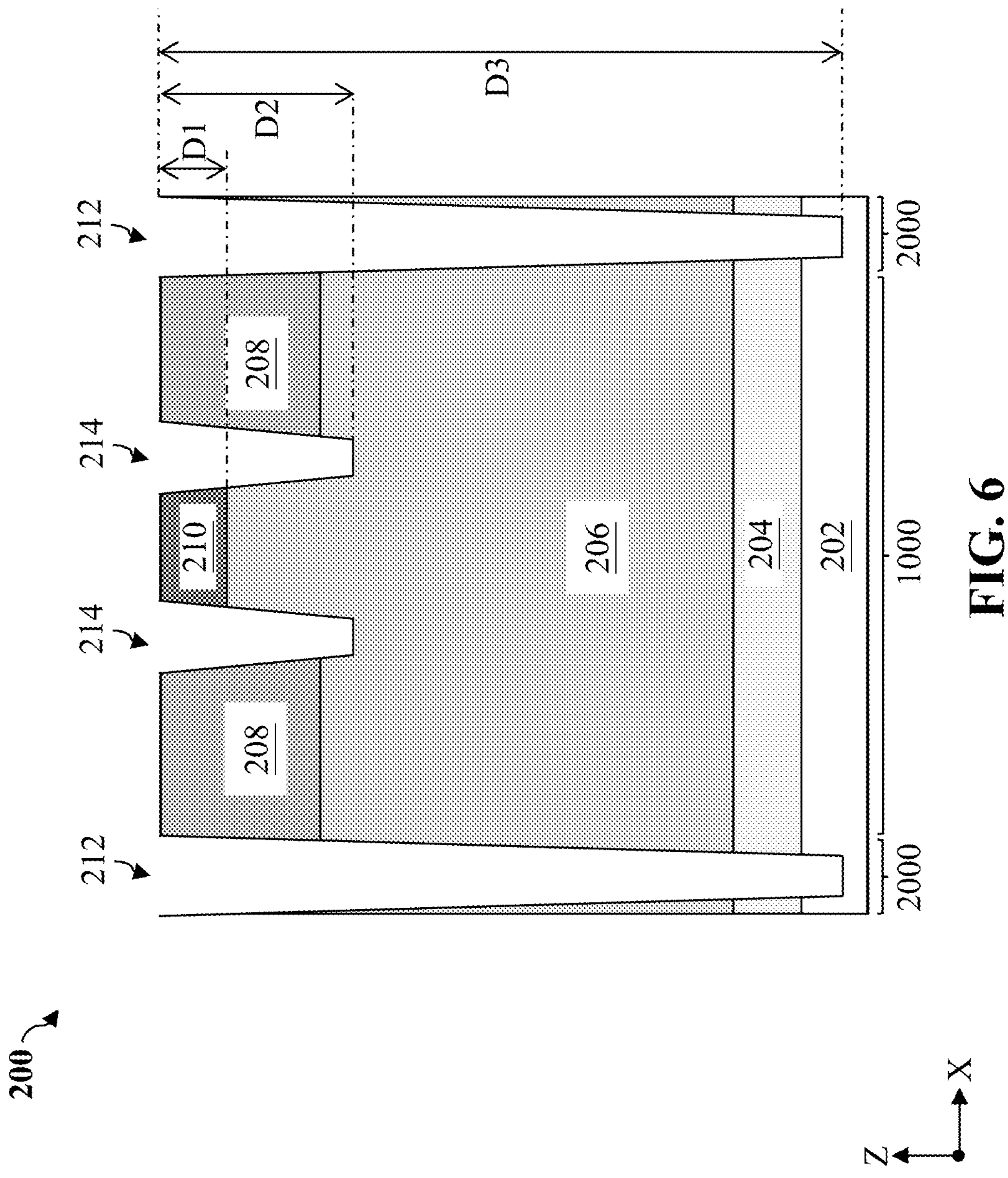

Referring to FIGS. 1 and 6, method 100 includes a block 112 where a second etching process is performed to form a second trench 214 disposed between the p-type well 208 and the n-type doped region 210. In some embodiments, the formation of the second trench 214 includes forming a patterned mask film (e.g., photoresist layer or a hard mask layer) (not shown) over the workpiece 200. The patterned mask film may include an opening exposing portions of the p-type well 208 and the n-type doped region 210. In some embodiments, the patterned mask film may include silicon nitride, silicon carbonitride, silicon oxycarbide, silicon oxynitride, silicon oxycarbonitride, other suitable materials, or combinations thereof, and may be formed by chemical vapor deposition (CVD), physical vapor deposition (PVD), other suitable methods, or combinations thereof. While using the patterned mask film as an etch mask, a second etching process is then performed to form the second trench 214 in the pixel region 1000. The patterned mask film may be selectively removed after the formation of the second trench 214. The second etching process and the first etching process may implement same etchant(s). As depicted in FIG. 6, the second trench 214 isolates the p-type well 208 and the n-type doped region 210. For example, the p-type well 208 and the n-type doped region 210 are exposed in the second trench 214. In an embodiment, in a top view, the second trench 214 includes a ring shape and surrounds the n-type doped region 210. In the present embodiment, the second trench 214 has a depth D2 greater than a depth D1 of the n-type doped region 210 such that the gate structure formed in the second trench 214 may provide better control for the charge transfer. In an embodiment, the depth D2 of the second trench 214 is less than a depth D3 of the first trench 212. In some alternative embodiments, the second trench 214 may be formed before forming the first trench 212.

Figure 7:
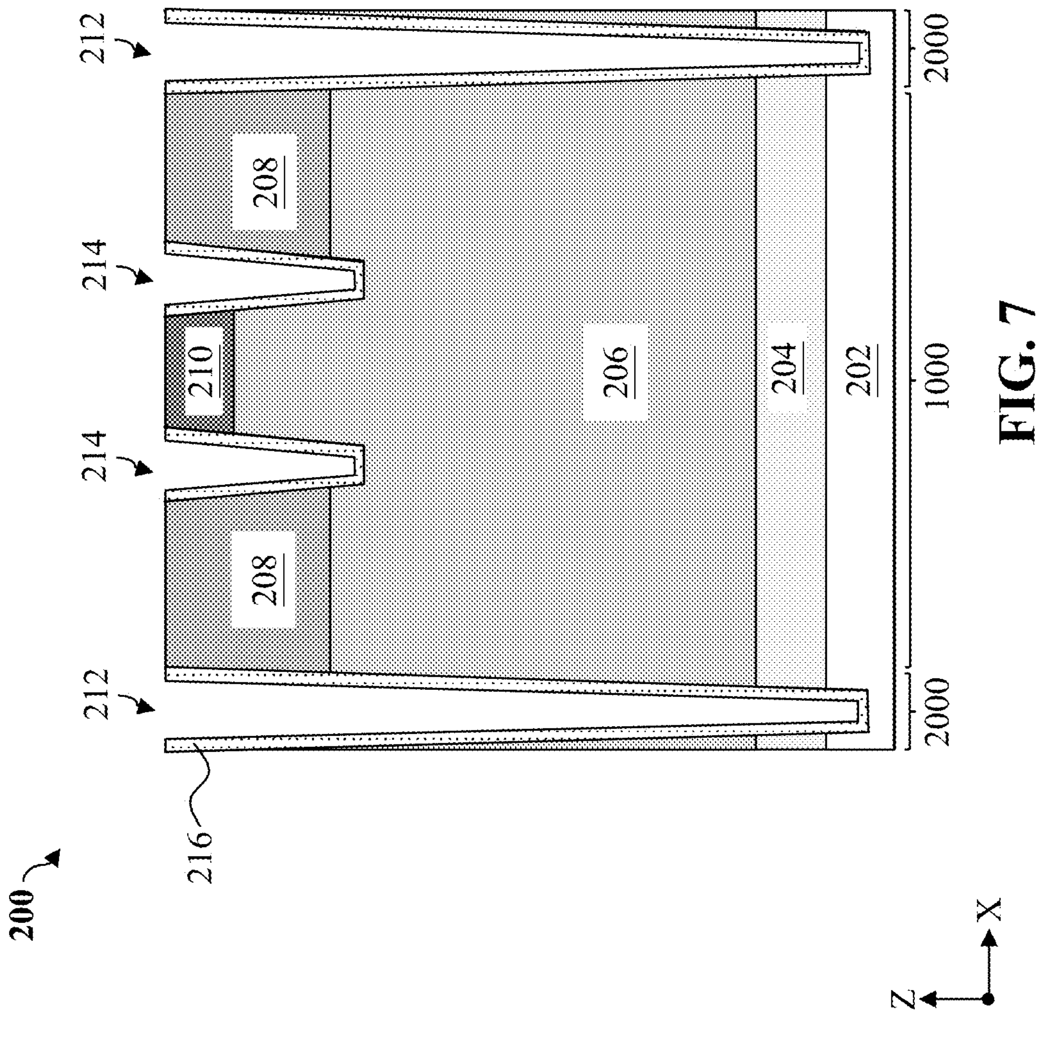

Referring to FIGS. 1 and 7, method 100 includes a block 114 where a dielectric liner 216 is conformally formed over the workpiece 200 and in the first and second trenches 212 and 214. In some embodiments, the dielectric liner 216 may include low-k dielectric materials such as silicon oxide, high-k (having a dielectric constant greater than that of silicon oxide, which is approximately 3.9) dielectric materials such as silicon nitride, aluminum oxide, tantalum oxide, hafnium oxide, titanium oxide, zirconium oxide, silicon oxynitride, combinations thereof, or other suitable materials. In embodiments represented in FIG. 7, the dielectric liner 216 is conformally formed over the workpiece 200 by a deposition process, such as atomic layer deposition (ALD), chemical vapor deposition (CVD), thermal oxidation, or other suitable methods. The term "conformally" may be used herein for ease of description of a layer having a substantially uniform thickness over various regions. The deposition thickness of the dielectric liner 216 may be between about 5 nm and about 50 nm. In some embodiments, the dielectric liner 216 may be a multi-layer structure. For example, the formation of the dielectric liner 216 may include conformally forming a first liner layer and conformally depositing a second liner layer over the first liner layer. After the deposition of the dielectric liner 216, a planarization process (e.g., chemical mechanical polishing) may be performed to remove excess portions of the dielectric liner 216 formed outside the first and second trenches 212 and 214.

Figure 8:
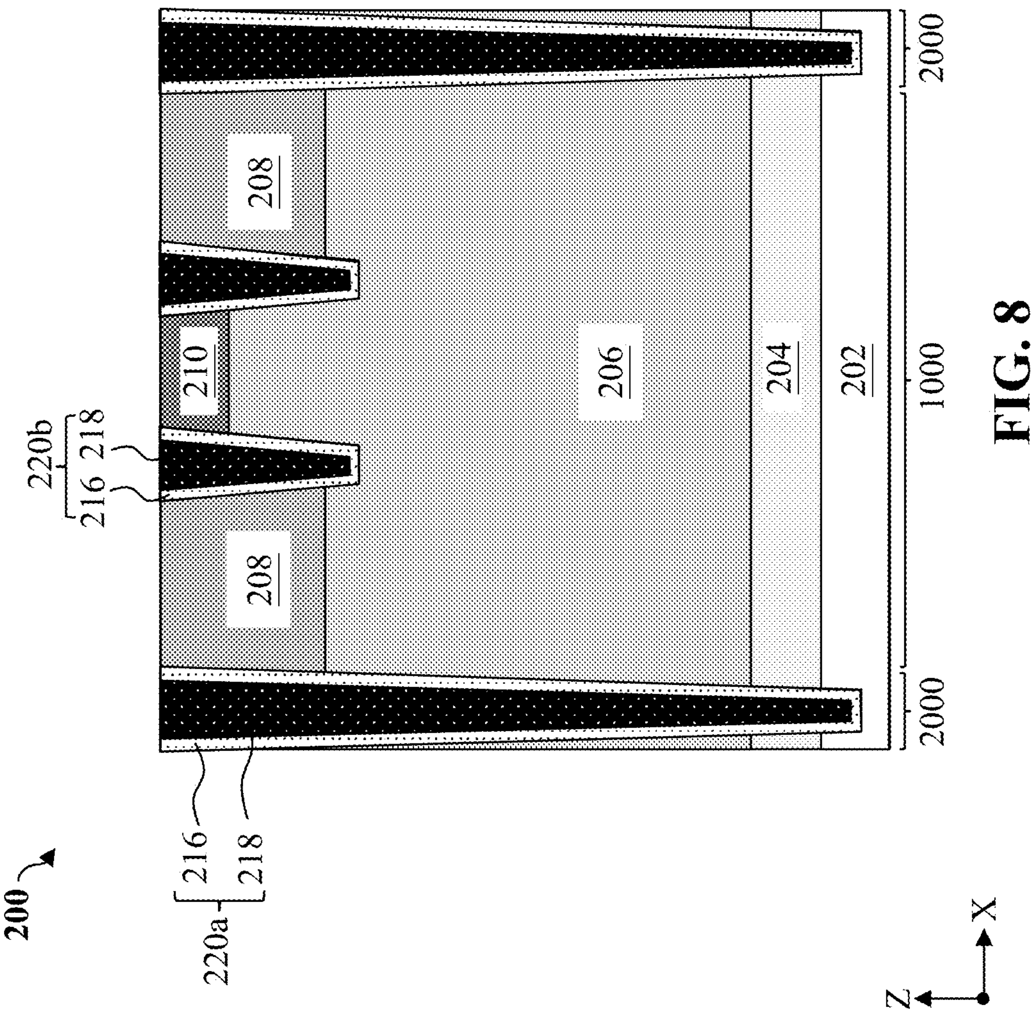
Figure 9:
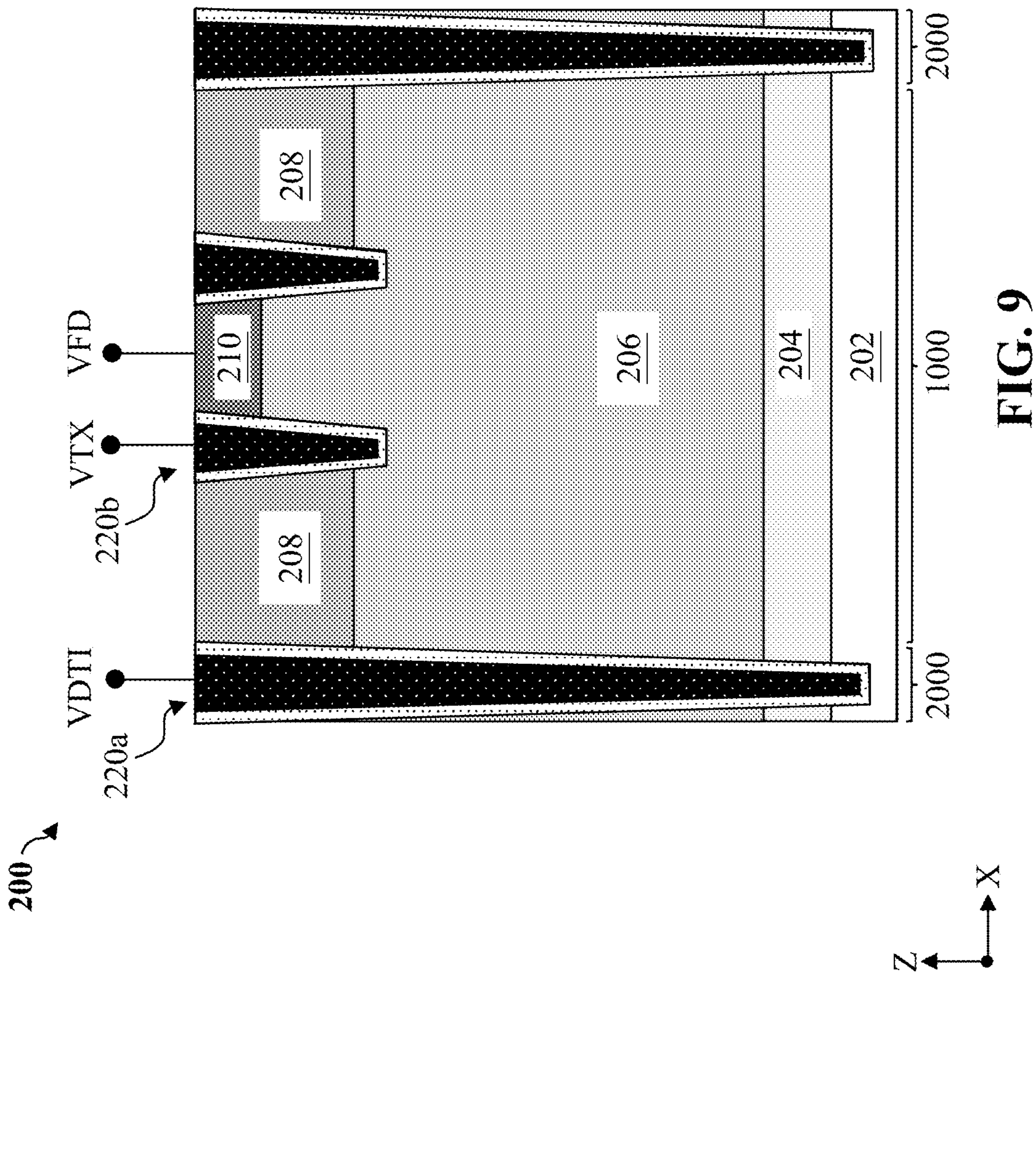

Referring to FIGS. 1 and 8-9, method 100 includes a block 116 where a conductive material layer 218 is formed over the workpiece 200 and in the first and second trenches 212 and 214. The conductive material layer 218 is deposited over the workpiece 200 to substantially fill the first and second trenches 212 and 214. In some embodiments, the conductive material layer 218 may include doped polysilicon, titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC), aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or combinations thereof. In various embodiments, the conductive material layer 218 may be formed by ALD, PVD, CVD, e-beam evaporation, or other suitable process. In some embodiments, a composition of the conductive material layer 218 may be selected to increase the reflectivity of the to-be-formed deep trench isolation (DIT) structure **220*a* (shown in FIG. 8**) and reduce light penetration.

After the deposition of the conductive material layer 218, a planarization process (e.g., chemical mechanical polishing) may be performed to remove excess portions of the conductive material layer 218. The planarization process also defines a structure of a deep trench isolation (DTI) structure **220*a* formed in the first trench 212 and a structure of a vertical gate structure 220*b* formed in the second trench 214. The deep trench isolation structure 220*a* tracks the shape of the first trench 212 and is formed in the isolation region 2000 to isolate or reduce electrical and optical crosstalk between two adjacent pixels. The vertical gate structure 220*b* tracks the shape of the second trench 214 and is formed in the pixel region 1000. In various embodiments, a pixel may include a transfer transistor. A gate structure of the transfer transistor may be referred to as a transfer gate. In the present embodiments, the vertical gate structure 220*b* is the transfer gate of a transfer gate transistor. A depth D2 (shown in FIG. 6) of the vertical gate structure 220*b* is less than a depth D3 (shown in FIG. 6) of the deep trench isolation structure 220*a*. In the present embodiments, the depth D2 of the vertical gate structure 220*b* is greater than the depth D1 of the floating diffusion region 210. In a top view, the deep trench isolation structure 220*a* surrounds the pixel region 1000, and the vertical gate structure 220*b* surrounds the floating diffusion region 210. After forming the deep trench isolation structure 220*a* and the vertical gate structure 220*b*, other components or features of a pixel (not explicitly shown) may be formed in the pixel region 1000**.

When the workpiece 200 is in operation, the n-type semiconductor layer 206 of the photodiode is a potential well for storing photoelectrons. A bias voltage VDTI (shown in FIG. 9) may be applied to the conductive material layer 218 of the deep trench isolation structure **220*a* so as to use field effect to generate carrier accumulation near sidewalls of the deep trench isolation structure 220*a*. In embodiments where the second semiconductor layer 206 is a n-type semiconductor layer 206, it is desirable to form hole accumulation. Providing hole accumulation would repel photoelectrons in the n-type semiconductor layer 206, as such, the photoelectrons could be away from the interface between the n-type semiconductor layer 206 and the deep trench isolation structure 220*a*. In an embodiment, the bias voltage VDTI may be configured to be a negative bias such that electrons stored in the n-type semiconductor layer 206 are repelled from the deep trench isolation structure 220*a*. A bias voltage VTX may be applied to the vertical gate structure 220*b*, and a bias voltage VFD may be applied to the floating diffusion region 210. Whether electrons in the n-type semiconductor layer 206 can move to the floating diffusion region 210 is controlled by the bias voltage VTX and the bias voltage VFD. More specifically, when the transfer gate transistor is turned off, the bias voltage VTX may be configured to be a negative bias to pull up the surrounding potential energy, and electrons stored in the n-type semiconductor layer 206 may not reach the floating diffusion region 210 even when the bias voltage VFD is a positive bias. When the transfer gate transistor is turned on, the bias voltage VTX may be configured to be a positive bias to pull down the surrounding potential, and electrons in the n-type semiconductor layer 206 can move upwardly and enter into the floating diffusion region 210** when the bias voltage VFD is a positive bias.

In some embodiments, after forming features in the pixel region 1000, further process may be performed to form an interconnect structure 222 over the first surface 202*a* of the substrate 202. In some embodiments, the interconnect structure 222 may include multiple interlayer dielectric (ILD) layers and multiple metal lines or contact vias (e.g., gate vias) in each of the ILD layers. The metal lines and contact vias in each ILD layer may be formed of metal, such as aluminum, tungsten, ruthenium, or copper. Because the interconnect structure 222 is formed over the front side of the workpiece 200, the interconnect structure 222 may also be referred to as a front-side interconnect structure 222. The bias voltages VDTI, VTX, and/or VFD may be applied to the deep trench isolation structure 220*a*, the vertical gate structure 220*b*, and the floating diffusion region 210, respectively, via the metal lines and contact vias in the interconnect structure.

Figure 10:
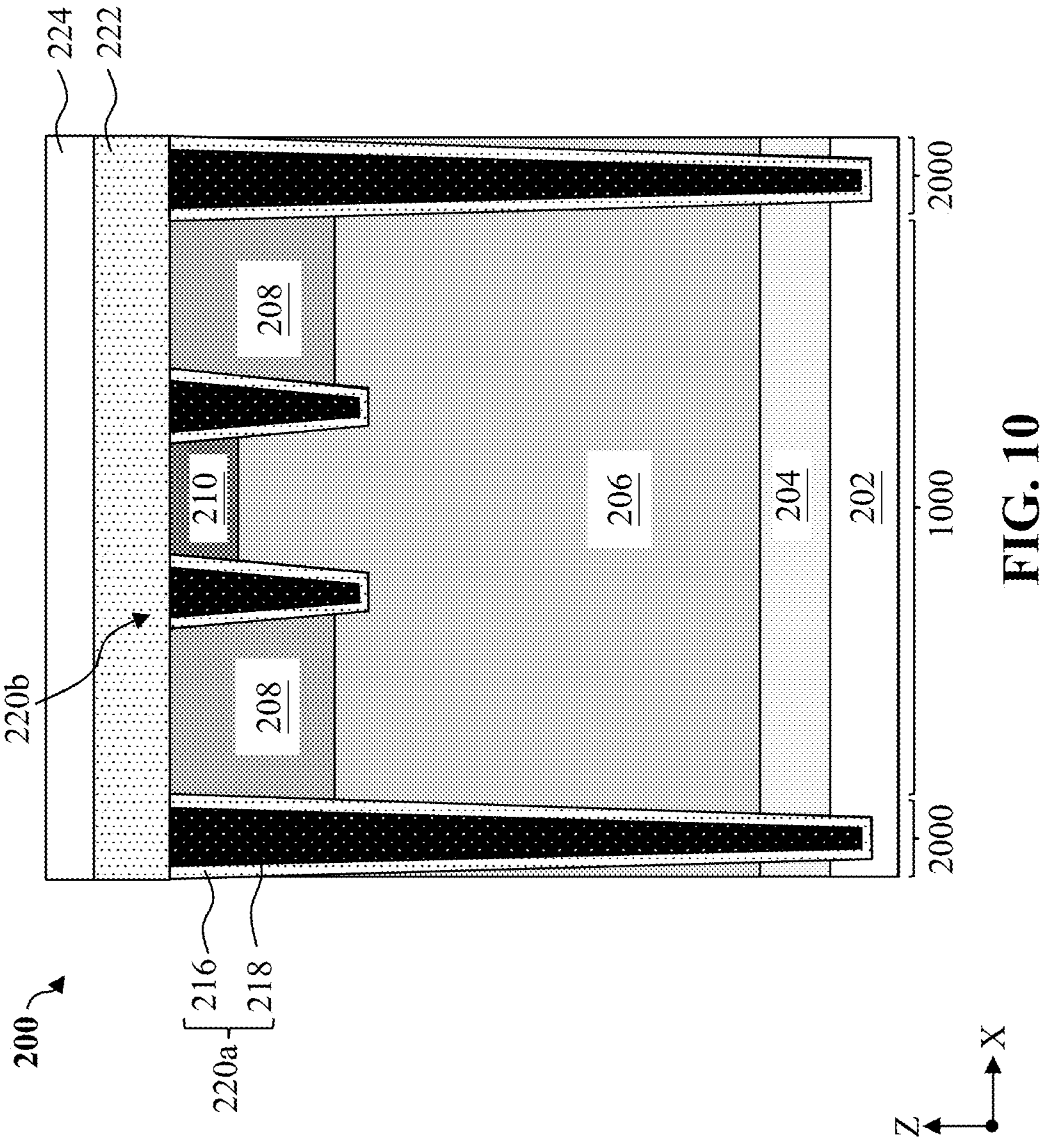
Figure 11:
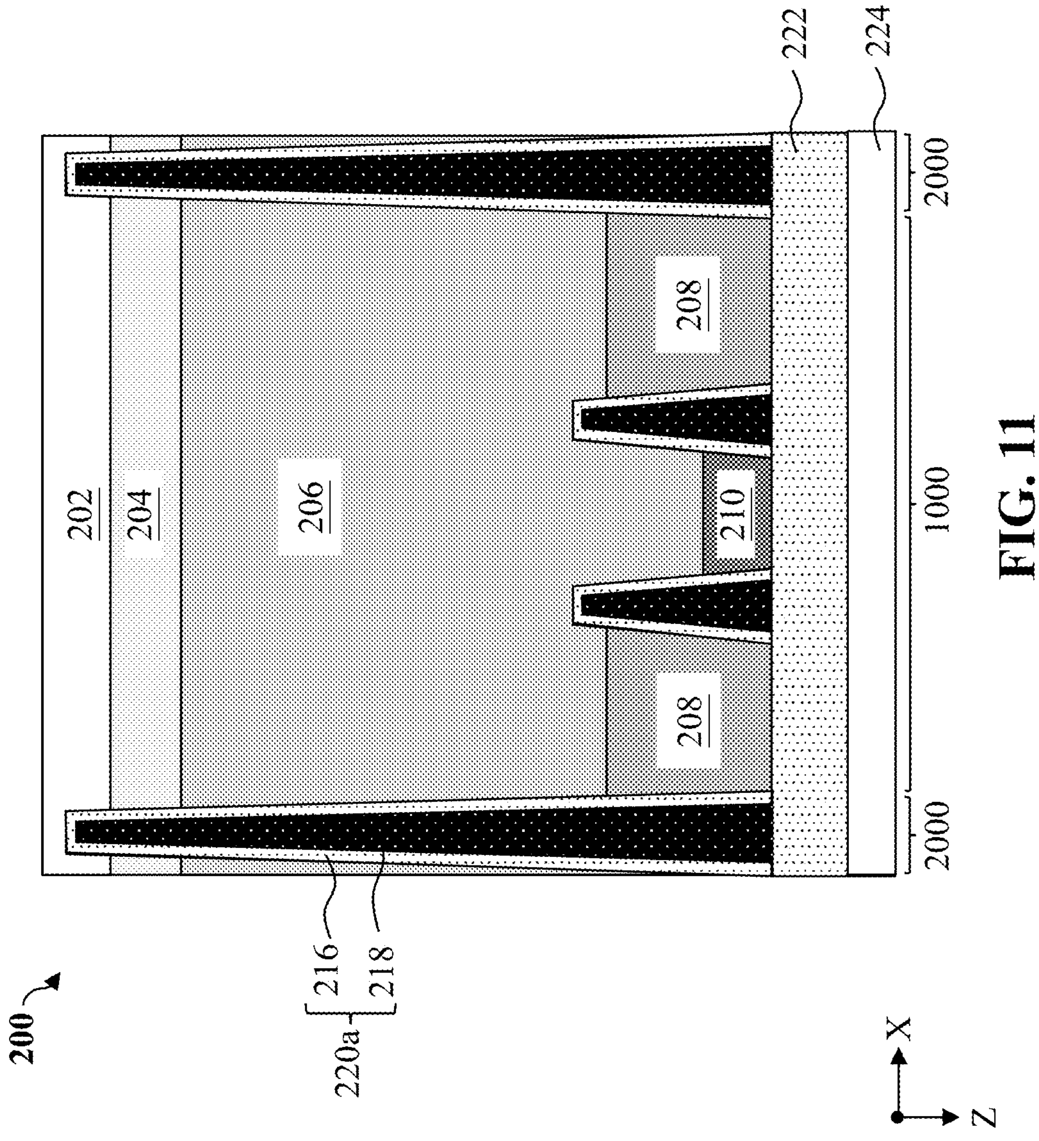
Figure 12:
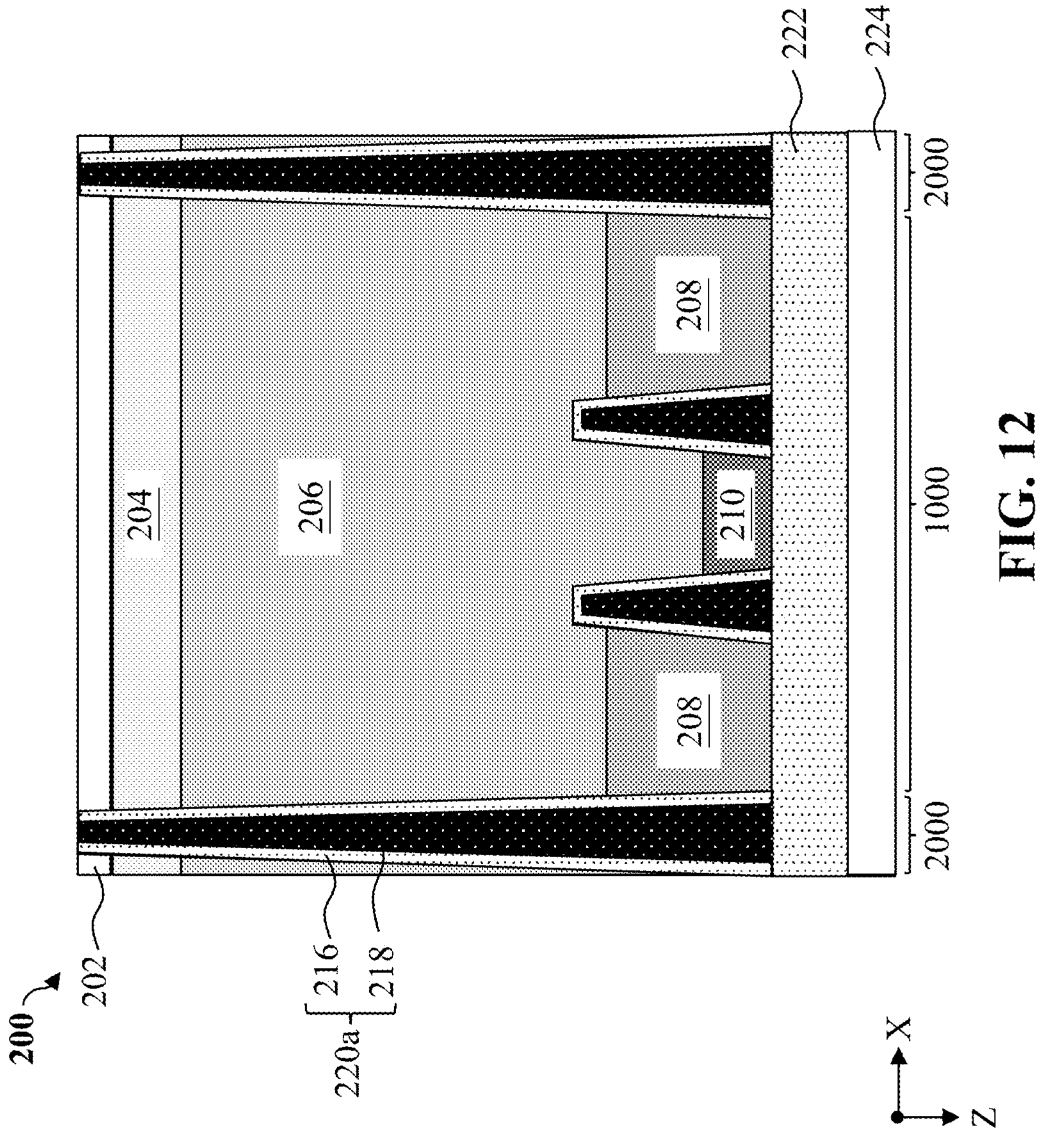

Referring to FIGS. 1 and 10-12, method 100 includes a block 118 where the workpiece 200 is flipped over and a planarization process is performed to the back-side surface (e.g., the second surface 202*b*) of the workpiece 200. Referring to FIG. 10, another substrate 224 is bonded to or attached to the interconnect structure 222. In some embodiments, the substrate 224 may be bonded to the workpiece 200 by fusion bonding, by use of an adhesion layer, or by other bonding methods. In some instances, the substrate 224 may be a carrier substrate and may include semiconductor materials (such as silicon), sapphire, glass, polymeric materials, or other suitable materials. In some embodiments, the substrate 224 may include application specific integrated circuit (ASIC). The workpiece 200 is then flipped over, as shown in FIG. 11, where the substrate 202 is at the top and is disposed over the interconnect structure 222. Referring to FIG. 12, the workpiece 200 is thinned, planarized, recessed, etched and/or grinded from the second surface 202*b* until the conductive material layer 218 in the DTI structure 220*a* is exposed. In the present embodiment, the substrate 202 may be partially removed. After the thinning down process, the DTI structure 220*a* extends completely through the p-type semiconductor layer 204 and the n-type semiconductor layer 206 and may be referred to as a full DTI (FDTI) structure 220*a*. The pixel formed in a pixel region 1000 is thus electrically and optically isolated from pixels in adjacent pixel regions 1000 by the FDTI structures 220*a*.

Figure 13:
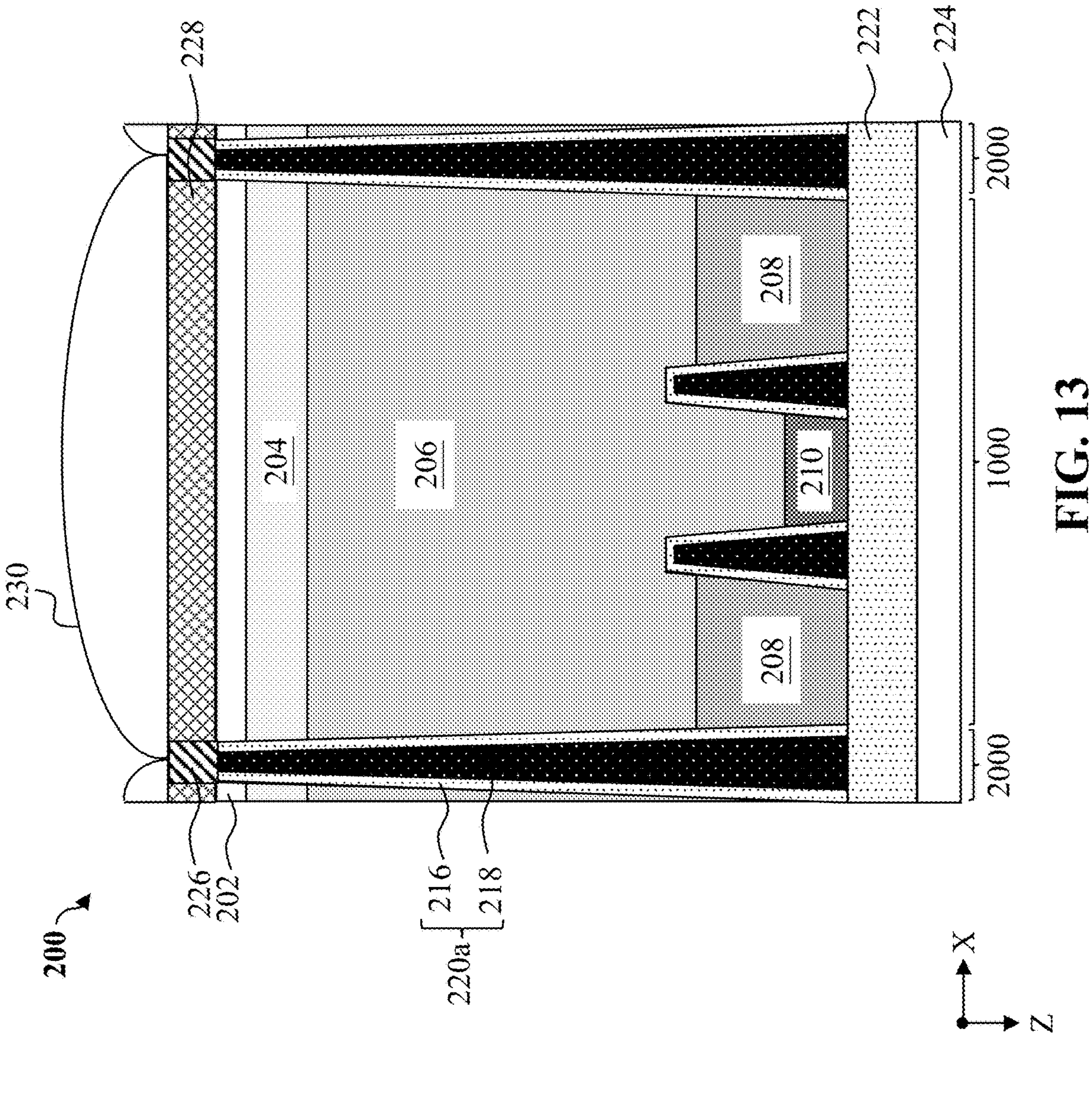

Referring to FIGS. 1 and 13, method 100 includes a block 120 where further processes are performed. Such further processes may include forming grids 226, color filters 228 and micro-lenses 230. Other suitable processes may be further performed to finish the fabrication of the semiconductor structure 200, which is a back-side illuminated image sensor in an embodiment.

In the above embodiments, the first trench 212 for forming the DTI structure 220*a* therein is formed from the front-side surface of the n-type semiconductor layer 206 and includes tapered sidewalls. In some alternative embodiments, as depicted in FIG. 14, the first trench 212 and thus the DTI structure 220*a* formed therein may have substantially vertical sidewalls. The profile of the first trench 212 may be adjusted by adjusting etching parameters. In an alternative embodiment, as depicted in FIG. 15, the first trench 212 may be formed from the back-side surface of the n-type semiconductor layer 206 and includes tapered sidewalls. For example, the first trench 212 and the deep trench isolation structure 220*a* may be formed after the workpiece 200 is flipped over.

In the above embodiments, in a top view, the p-type well 208 may be a ring shape and surrounds the floating diffusion region 210. In some other embodiments, for example, when the workpiece 200 includes a vertical gate structure that spans a large width along the X direction, another p-type well 208' may be formed between two portions of the vertical gate structure 220*b* and under the floating diffusion region 210. In some embodiments, the p-type well 208' and the p-type well 208 may be formed simultaneously by performing a blanket ion implantation process. Thus, a dopant concentration of the p-type well 208' is the same as a dopant concentration of the p-type well 208. In some other embodiments, the p-type well 208' may be formed after the formation of the p-type well 208. For example, as described with reference to FIG. 3, a first ion implantation mask may be provided, and a first ion implantation process may be performed to form the p-type well 208. The first ion implantation mask may be removed after forming the p-type well 208. Then, a second ion implantation mask may be provided, and a second ion implantation process may be performed to form the p-type well 208' surrounded by the p-type well 208. A dopant concentration of the p-type well 208' may be different than a dopant concentration of the p-type well 208. The floating diffusion region 210 may be formed after forming the p-type well 208'. Operations of blocks 110-120 of method 100 may be performed to finish the fabrication of the workpiece 200.

FIG. 17 depicts a fragmentary top view of the semiconductor structure 200. In some embodiments, the workpiece 200 shown in FIG. 15 may be a cross-sectional view of the semiconductor structure 200 taken along line A-A' as shown in FIG. 17. As depicted in FIG. 17, the gate structure 220*b* surrounds the floating diffusion region 210, a photodiode 232 surrounds the gate structure 220*b*, and the deep trench isolation structure 220*a* surrounds the photodiode 232 and isolates the photodiode 232 from adjacent photodiodes 232. A top view of the floating diffusion region 210 and a top view of the gate structure 220*b* may include a square shape, a rectangle shape, a rounded square shape, or a rounded rectangle shape.

The semiconductor structure 200 also includes a number of contacts formed over the deep trench isolation structure 220*a*, the photodiodes 232, and the gate structure 220*b*. The bias voltages VDTI, VTX, and/or VFD may be applied to the deep trench isolation structure 220*a*, the vertical gate structure 220*b*, and the floating diffusion region 210, respectively, via the contacts. The semiconductor structure 200 also includes a drive transistor 236 adjacent the deep trench isolation structure 220*a*. The drive transistor 236 may act as a source follower and may be configured to amplify charges stored in the floating diffusion region 210 to achieve the charge-voltage conversion. The semiconductor structure 200 also includes a reset transistor 238. Although not shown, a source/drain terminal of the reset transistor 238 may be electrically connected to the floating diffusion region 210 and a gate terminal of the reset transistor 238 may be configured to receive a reset signal such that the reset transistor 238 may be turned on and off to reset the floating diffusion region 210 to a predetermined voltage (e.g., a voltage that is equal to or close to a power supply voltage VDD) in response to the reset signal. The semiconductor structure 200 also includes a select transistor 240 (e.g., a row select transistor for selecting a row of pixels for operation). Although not shown, a source/drain terminal of the select transistor 240 may be electrically connected to a source/drain terminal of the drive transistor 236, and a gate terminal of the select transistor 240 is configured to receive a unit pixel selection signal such that the select transistor 240 provides an output signal of the drive transistor 236 in response to the unit pixel selection signal. The semiconductor structure 200 may include additional features.

In the above embodiment described with reference to FIG. 17, the top view of the floating diffusion region 210 and the top view of the gate structure 220*b* each include a rounded rectangle shape. Other shapes are also possible. For example, as depicted in FIG. 18, the top view of the floating diffusion region 210 and the top view of the gate structure 220*b* each include a hexagon shape.

Although not intended to be limiting, one or more embodiments of the present disclosure provide many benefits to image sensors and an imaging system. For example, by forming the DTI structure, a pixel may be both electrically and optically isolated from its neighboring pixels. Optical cross talk may be advantageously reduced or even substantially eliminated. By applying a negative bias voltage to the DTI structure, holes may accumulate at the sidewall surface of the DTI structure, leading to an increased passivation, thereby reducing the dark current and white pixels without compromising other aspects of the device. In addition, n-type region in the photodiode in small pixels are formed by mask-less epitaxial growth processes, rather than using photolithography processes that require high resolution, fabrication costs may be advantageously reduced. Further, the disclosed methods can be easily integrated into existing semiconductor manufacturing processes.

The present disclosure provides for many different embodiments. Semiconductor structures and methods of fabrication thereof are disclosed herein. In one exemplary aspect, the present disclosure is directed to a method. The method includes epitaxially growing a p-type semiconductor layer on a substrate, epitaxially growing an n-type semiconductor layer over the p-type semiconductor layer, after the epitaxially growing of the n-type semiconductor layer, forming a p-type well in the n-type semiconductor layer, forming an n-type doped region in the n-type semiconductor layer and surrounded by the p-type well, forming a first trench extending through the n-type semiconductor layer and the p-type semiconductor layer and surrounding the p-type well, and forming a first isolation structure in the first trench.

In some embodiments, the method may also include forming a second trench to separate the p-type well and the n-type doped region, and forming a second isolation structure in the first trench. In some embodiments, a depth of the second trench may be greater than a depth of the n-type doped region. In some embodiments, in a top view, the second isolation structure surrounds the n-type doped region. In some embodiments, the forming of the first isolation structure may include conformally depositing a dielectric liner over the substrate, depositing a conductive material layer over the dielectric liner, and performing a planarization process to the dielectric liner and the conductive material layer to expose a top surface of the n-type semiconductor layer. In some embodiments, the conductive material layer may include doped polysilicon, tungsten, titanium, or aluminum. In some embodiments, a dopant concentration of an upper portion of the n-type semiconductor layer may be different than a dopant concentration of a lower portion of the n-type semiconductor layer. In some embodiments, the method may also include, after the forming of the p-type well in the n-type semiconductor layer, forming a p-type doped region in the n-type semiconductor layer, wherein the p-type doped region is disposed directly under the n-type doped region.

In another exemplary aspect, the present disclosure is directed to a method. The method includes forming an n-type semiconductor layer of a photodiode over a top surface of a substrate, forming a p well in the n-type semiconductor layer of the photodiode, forming a floating diffusion region in the n-type semiconductor layer of the photodiode and adjacent the p well, forming an isolation structure extending through the p well and the n-type semiconductor layer of the photodiode, and forming a gate structure extending through the floating diffusion region and extending into the n-type semiconductor layer of the photodiode, wherein the gate structure is disposed between the p well and the floating diffusion region, where, in a top view, the gate structure surrounds the floating diffusion region.

In some embodiments, the method may also include epitaxially forming a p-type semiconductor layer on the top surface of the substrate, wherein the n-type semiconductor layer of the photodiode is spaced apart from the substrate by the p-type semiconductor layer. In some embodiments, the forming of the n-type semiconductor layer may include epitaxially forming an in-situ doped n-type semiconductor layer over the top surface of the substrate, where a dopant concentration of an upper portion of the n-type semiconductor layer is different than a dopant concentration of a lower portion of the n-type semiconductor layer. In some embodiments, the forming of the isolation structure may include performing a first etching process to form a first trench extending through the p well and the n-type semiconductor layer of the photodiode, conformally depositing a dielectric liner over the substrate and in the first trench, depositing a conductive material layer over the dielectric liner and in the first trench, and performing a planarization process to the dielectric liner and the conductive material layer to expose a top surface of the n-type semiconductor layer. In some embodiments, the method may also include performing a planarization process to a bottom surface of the substrate to expose the conductive material layer, the bottom surface of the substrate being opposite to the top surface of the substrate, and forming a color filter under the photodiode. In some embodiments, the forming of the gate structure may also include performing a second etching process to form a second trench separating the p well and the floating diffusion region, where the conformally depositing of the dielectric liner further partially fills the second trench, and the depositing of the conductive material layer further fills a remaining portion of the second trench. In some embodiments, a bottom surface of the gate structure may be below the floating diffusion region. In some embodiments, a dopant concentration of the floating diffusion region may be greater than a dopant concentration of the p well.

In yet another exemplary aspect, the present disclosure is directed to a semiconductor structure. The semiconductor structure includes a first semiconductor layer comprising a first-type dopant, a first doped region formed in the first semiconductor layer and comprising the first-type dopant, a gate structure extending into the first semiconductor layer and adjacent the first doped region, wherein, in a top view, the gate structure surrounds the first doped region, a second doped region formed in the first semiconductor layer and spaced apart from the first doped region by the gate structure, wherein the second doped region comprises a second-type dopant having a doping polarity opposite to a doping polarity of the first-type dopant, and an isolation structure extending through the first semiconductor layer and adjacent the second doped region.

In some embodiments, the semiconductor structure may also include a third semiconductor layer disposed under the first semiconductor layer and comprising the second-type dopant, where the isolation structure further extends through the third semiconductor layer. In some embodiments, the isolation structure may also include a conductive layer and a dielectric layer extending along a sidewall surface of the conductive layer. In some embodiments, a depth of the isolation structure may be greater than a depth of the gate structure, and the depth of the gate structure may be greater than a depth of the first doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

epitaxially growing a p-type semiconductor layer on a substrate;

epitaxially growing an n-type semiconductor layer over the p-type semiconductor layer;

after the epitaxially growing of the n-type semiconductor layer, forming a p-type well in the n-type semiconductor layer;

forming an n-type doped floating diffusion region in the n-type semiconductor layer and surrounded by the p-type well;

forming a first trench extending through the n-type semiconductor layer and the p-type semiconductor layer and surrounding the p-type well;

after the forming of the n-type doped floating diffusion region, forming a second trench extending through the p-type well and the n-type doped floating diffusion region; and forming a first isolation structure in the first trench and a gate structure in the second trench.

2. The method of claim 1, wherein a depth of the second trench is greater than a depth of the n-type doped floating diffusion region and is less than a depth of the first trench.

3. The method of claim 2, wherein a depth of the p-type well is greater than the depth of the n-type doped floating diffusion region.

4. The method of claim 1, wherein, in a top view, the gate structure surrounds the n-type doped floating diffusion region.

5. The method of claim 1, wherein the forming of the first isolation structure comprises:

conformally depositing a dielectric liner over the substrate;

depositing a conductive material layer over the dielectric liner; and performing a planarization process to the dielectric liner and the conductive material layer to expose a top surface of the n-type semiconductor layer.

6. The method of claim 5, wherein the conductive material layer comprises doped polysilicon, tungsten, titanium, or aluminum.

7. The method of claim 1, wherein a dopant concentration of an upper portion of the n-type semiconductor layer is different than a dopant concentration of a lower portion of the n-type semiconductor layer.

8. The method of claim 1, further comprising:

after the forming of the p-type well in the n-type semiconductor layer, forming a p-type doped region in the n-type semiconductor layer, wherein the p-type doped region is disposed directly under the n-type doped floating diffusion region.

9. A method, comprising:

forming an n-type semiconductor layer of a photodiode over a top surface of a substrate;

forming a p well in the n-type semiconductor layer of the photodiode;

forming a floating diffusion region in the n-type semiconductor layer of the photodiode and adjacent the p well, the floating diffusion region being configured to receive charges from the photodiode;

forming an isolation structure extending through the p well and the n-type semiconductor layer of the photodiode; and forming a gate structure extending through the floating diffusion region without extending through the n-type semiconductor layer of the photodiode, wherein the gate structure is disposed between the p well and the floating diffusion region, wherein, in a top view, the gate structure surrounds the floating diffusion region.

10. The method of claim 9, further comprising:

epitaxially forming a p-type semiconductor layer on the top surface of the substrate, wherein the n-type semiconductor layer of the photodiode is spaced apart from the substrate by the p-type semiconductor layer.

11. The method of claim 9, wherein the forming of the n-type semiconductor layer comprises epitaxially forming an in-situ doped n-type semiconductor layer over the top surface of the substrate, wherein a dopant concentration of an upper portion of the n-type semiconductor layer is different than a dopant concentration of a lower portion of the n-type semiconductor layer.

12. The method of claim 9, wherein the forming of the isolation structure comprises:

performing a first etching process to form a first trench extending through the p well and the n-type semiconductor layer of the photodiode;

conformally depositing a dielectric liner over the substrate and in the first trench;

depositing a conductive material layer over the dielectric liner and in the first trench; and performing a planarization process to the dielectric liner and the conductive material layer to expose a top surface of the n-type semiconductor layer.

13. The method of claim 12, further comprising:

performing a planarization process to a bottom surface of the substrate to expose the conductive material layer, the bottom surface of the substrate being opposite to the top surface of the substrate; and forming a color filter under the photodiode.

14. The method of claim 12, wherein the forming of the gate structure comprises:

performing a second etching process to form a second trench separating the p well and the floating diffusion region, wherein the conformally depositing of the dielectric liner further partially fills the second trench, and the depositing of the conductive material layer further fills a remaining portion of the second trench.

15. The method of claim 9, wherein a bottom surface of the gate structure is below the floating diffusion region.

16. The method of claim 9, wherein a dopant concentration of the floating diffusion region is greater than a dopant concentration of the p well.

17. A method, comprising:

epitaxially growing an n-type semiconductor layer over a substrate;

forming a p-type well in the n-type semiconductor layer, wherein the p-type well extends from a top surface of the n-type semiconductor layer into the n-type semiconductor layer;

forming an n-type doped region in the n-type semiconductor layer and surrounded by the p-type well;

forming a first trench extending through the n-type semiconductor layer and a second trench separating the n-type doped region and the p-type well;

depositing a dielectric layer in the first trench and the second trench; and depositing a conductive layer over the dielectric layer and in the first trench and the second trench, thereby forming a first feature in the first trench and a second feature in the second trench, wherein, in a top view, the first feature surrounds the p-type well, and the second feature surrounds the n-type doped region.

18. The method of claim 17, wherein a depth of the first feature is greater than a depth of the second feature, and the depth of the second feature is greater than a depth of the p-type well and the n-type doped region.

19. The method of claim 17, further comprising:

forming an interconnect structure over the first feature and the second feature;

planarizing the substrate from its back to expose the conductive layer of the first feature; and forming color filters under the n-type semiconductor layer and the first feature.

20. The method of claim 17, wherein the p-type well laterally extends from the first feature to the second feature.

* * * * *